United States Patent [19]
Campardo et al.

[11] Patent Number: 6,122,200
[45] Date of Patent: Sep. 19, 2000

[54] ROW DECODER FOR A FLASH-EEPROM MEMORY DEVICE WITH THE POSSIBILITY OF SELECTIVE ERASING OF A SUB-GROUP OF ROWS OF A SECTOR

[75] Inventors: Giovanni Campardo, Bergamo; Rino Micheloni, Turate, both of Italy

[73] Assignee: STMicroelectronics, S.r.l., Agrate Brianza, Italy

[21] Appl. No.: 09/200,002

[22] Filed: Nov. 25, 1998

[30] Foreign Application Priority Data

Nov. 26, 1997 [EP] European Pat. Off. .............. 97830625

[51] Int. Cl.[7] .................................................. G11C 16/04
[52] U.S. Cl. ................................ 365/185.23; 365/185.33; 365/185.18
[58] Field of Search ........................ 365/185.23, 185.29, 365/185.33, 230.06, 185.11, 185.18

[56] References Cited

U.S. PATENT DOCUMENTS

| | | | |
|---|---|---|---|
| 5,077,691 | 12/1991 | Haddad et al. | 365/218 |
| 5,455,789 | 10/1995 | Nakamura et al. | 365/185.17 |
| 5,513,146 | 4/1996 | Atsumi et al. | 365/185.23 |
| 5,661,683 | 8/1997 | Song | 365/185.18 |
| 5,787,037 | 7/1998 | Amanai | 365/185.18 |
| 5,812,459 | 9/1998 | Atsumi et al. | 365/185.23 |

OTHER PUBLICATIONS

Jinbo, Toshikatsu; Hidetoshi Nakata; Kiyokazu Hashimoto; Takeshi Watanabe; Kazuhisa Ninomiya; Takahiko Urai; Mikio Koiki; Tatsuo Sato; Noriaki Kodama; Ken-ichi Oyama; and Takeshi Okazawa: "A 5-V-only 16-Mb Flash Memory with Sector Erase Mode," *8107 IEEE Journal of Solid-State Circuits 27* (1992) Nov., No. 11, New York, US.

*Primary Examiner*—Son T. Dinh
*Assistant Examiner*—Anh Phung
*Attorney, Agent, or Firm*—Theodore E. Galanthay, Esq.; Robert Iannucci, Esq.; Seed IP Law Group, PLLC

[57] ABSTRACT

A row decoder includes a plurality of pre-decoding circuits which, starting from row addresses, generate pre-decoding signals and a plurality of final decoding circuits which, starting from the pre-decoding signals, drive the individual rows of the array of the memory device. Each pre-decoding circuit has a push-pull output circuit with a pull-up transistor and a pull-down transistor and four parallel paths for the signal, a first path, supplied with low voltage, which drives the pull-up transistor during reading; a second path, supplied with a positive high voltage, which drives the pull-up transistor during programming and erasing; a third path, supplied with a low voltage, which drives the pull-down transistor during reading and programming; and a fourth path, supplied with a negative high voltage, which drives the pull-down transistor during erasing. Two selection stages enable selectively one of the first and second path, and one of the third and fourth path, depending on the operative step.

26 Claims, 5 Drawing Sheets

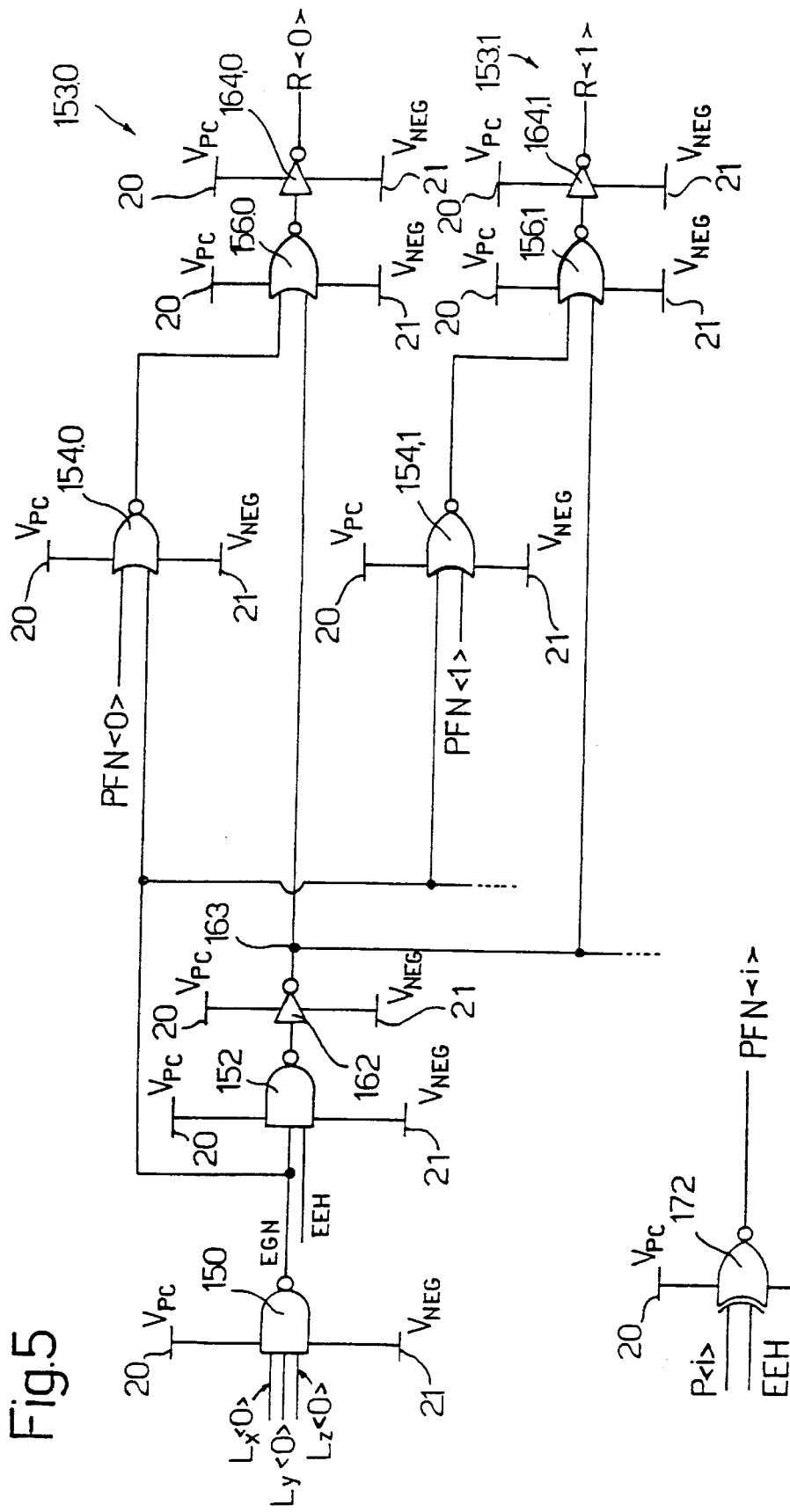

ROW DECODER FOR A FLASH-EEPROM MEMORY DEVICE WITH THE POSSIBILITY OF SELECTIVE ERASING OF A SUB-GROUP OF ROWS OF A SECTOR

TECHNICAL FIELD

The present invention relates to a row decoder for a flash-EEPROM memory device with the possibility of selective erasing of a subgroup of rows of a sector.

BACKGROUND OF THE INVENTION

As is known, flash memory devices comprise an array of cells arranged in rows and columns, wherein word lines connect the gate terminals of the cells arranged on a single row, and bit lines connect the drain terminals of the cells arranged on a single column. Individual memory array rows are thus addressed by a row decoder receiving an input coded address.

In flash memory devices, the memory array is divided into different sectors comprising cell blocks; in these devices the rows decoders permit reading and programming of individual cells of a sector, and only erasing of all the cells in the sector.

Such memory arrays are currently erased by applying a negative voltage to the gate terminals of the cells, for example, −10V, taking the source terminal to a positive voltage, for example, +5V, and leaving the drain terminal floating.

The method of erasing by sectors requires special measures when allocating the memory, since each time a datum stored in a sector is modified, it is necessary to erase and rewrite completely all the sector, and each sector has a separator device (which infer alia permits independent erasing from the other sectors) which has a large size (of approximately one hundred times the height of an array row). Consequently the design usually requires a compromise between the requirement to section the memory blocks as far as possible in order to erase only the components which need to, and not to increase excessively the total dimensions of the memory, owing to the presence of a large number of separators. However, this compromise does not always make it possible to obtain the best results.

SUMMARY OF THE INVENTION

An object of the present invention is thus to provide a row decoder allowing selective erasing of one or a plurality of rows of a sector of a memory array of a flash memory device and reducing the above-described compromises.

In one embodiment of the invention, the row decoder includes a decoding stage having at least one decoding circuit, a first line set to a first reference potential, a second line set to a second reference potential switching between said first reference potential and an erase potential lower than the first reference potential wherein said decoding circuit includes a first path and a second path arranged in parallel to one another and connected respectively to said first line and said second line, and a first selection circuit selectively enabling said first and second paths.

For the comprehension of the present invention, a preferred embodiment is now described, purely by way of non-limiting example, with reference to the attached drawings.

BRIEF DESCRIPTION OF THE DRAWINGS

FIGS. 2–6 show simplified electric circuit diagrams relating to the row decoder of the present invention.

DETAILED DESCRIPTION OF THE INVENTION

Figure 1:
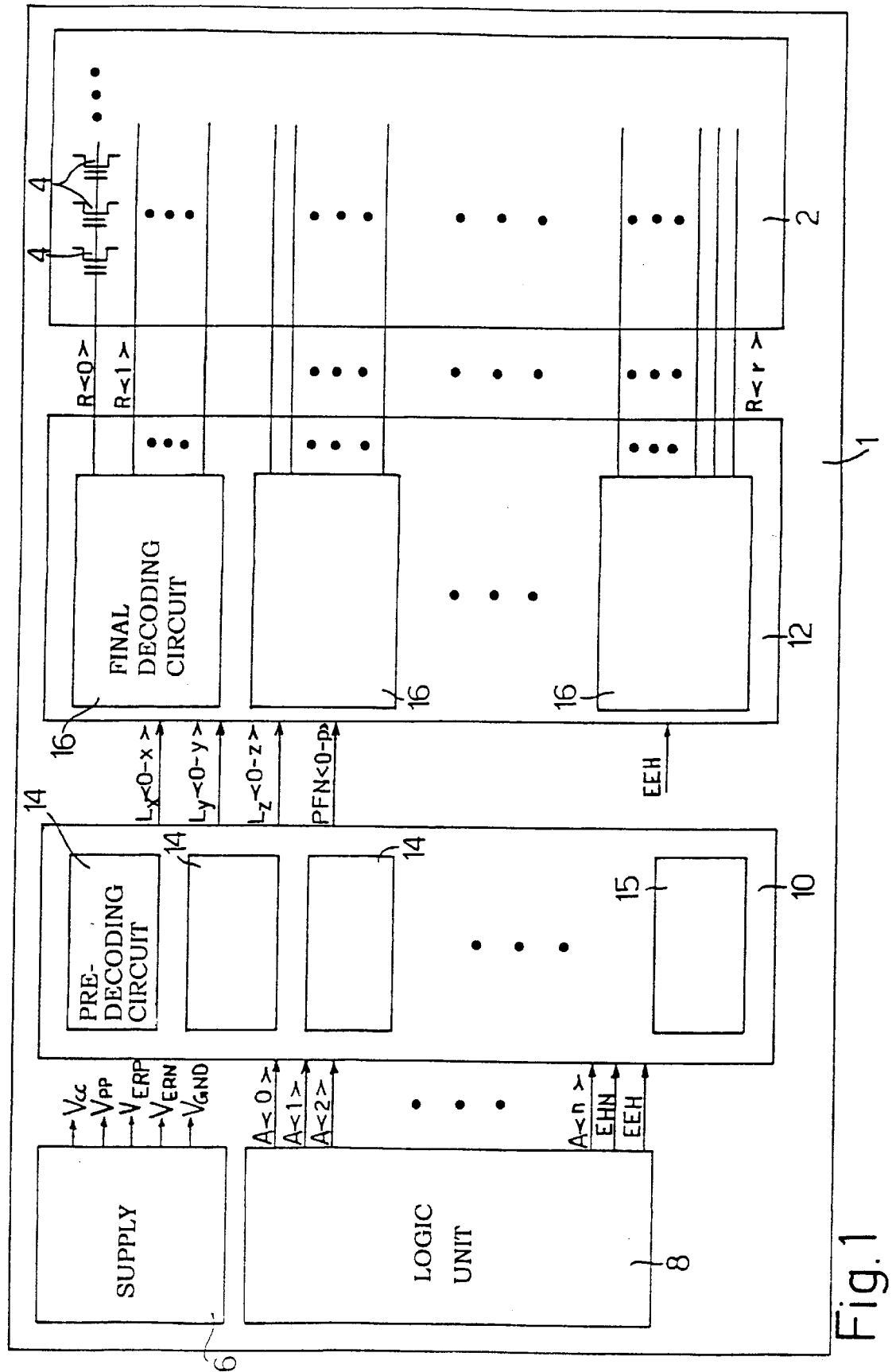
FIG. 1 shows the architecture of a flash memory device including a row decoder according to the present invention.

In FIG. 1, the numeral 1 indicates as a whole a memory device of the flash type which uses the negative gate erasing technique. The memory device 1 includes a memory array 2 having a plurality of cells 4 arranged in rows and columns; a supply stage 6 generating supply voltages $V_{CC}$, $V_{PP}$, $V_{ERP}$, $V_{ERN}$, $V_{GND}$; a logic stage 8 generating address signals A<0–n>, a program enabling signal EHN and an erase enabling signal EEH; a pre-decoding stage 10 receiving at the input the address signals A<0–n> and the program and erase enabling signals EHN and EEH and generating at the output pre-decoding signals Lx<0–x>, Ly<0–y>, Lz<0–z> and PFN<0–p>, in which x, y, z and p are pre-determined numbers; and a final decoding stage 12 receiving at the input the pre-decoding signals Lx, Ly, Lz and PFN, and generating at the output bias signals R<0–r>, r being the number of rows, each output bias signal being supplied to a respective row of the memory array 2.

Pre-decoding stage 10 includes a plurality of pre-decoding circuits 14 having the same structure, one for each pre-decoding signal Lx, Ly and Lz, and a plurality of pre-decoding circuits 15 having the same structure, one for each predecoding signal PFN; the circuits 14 and 15 receive the program and erase enabling signals EHN and EEH, but different address signals A. Similarly, the final decoding stage 12 includes a plurality of final decoding circuits 16 having the same structure, but receiving different combinations of the pre-decoding signals Lx, Ly, Lz and PFN.

Figure 2:
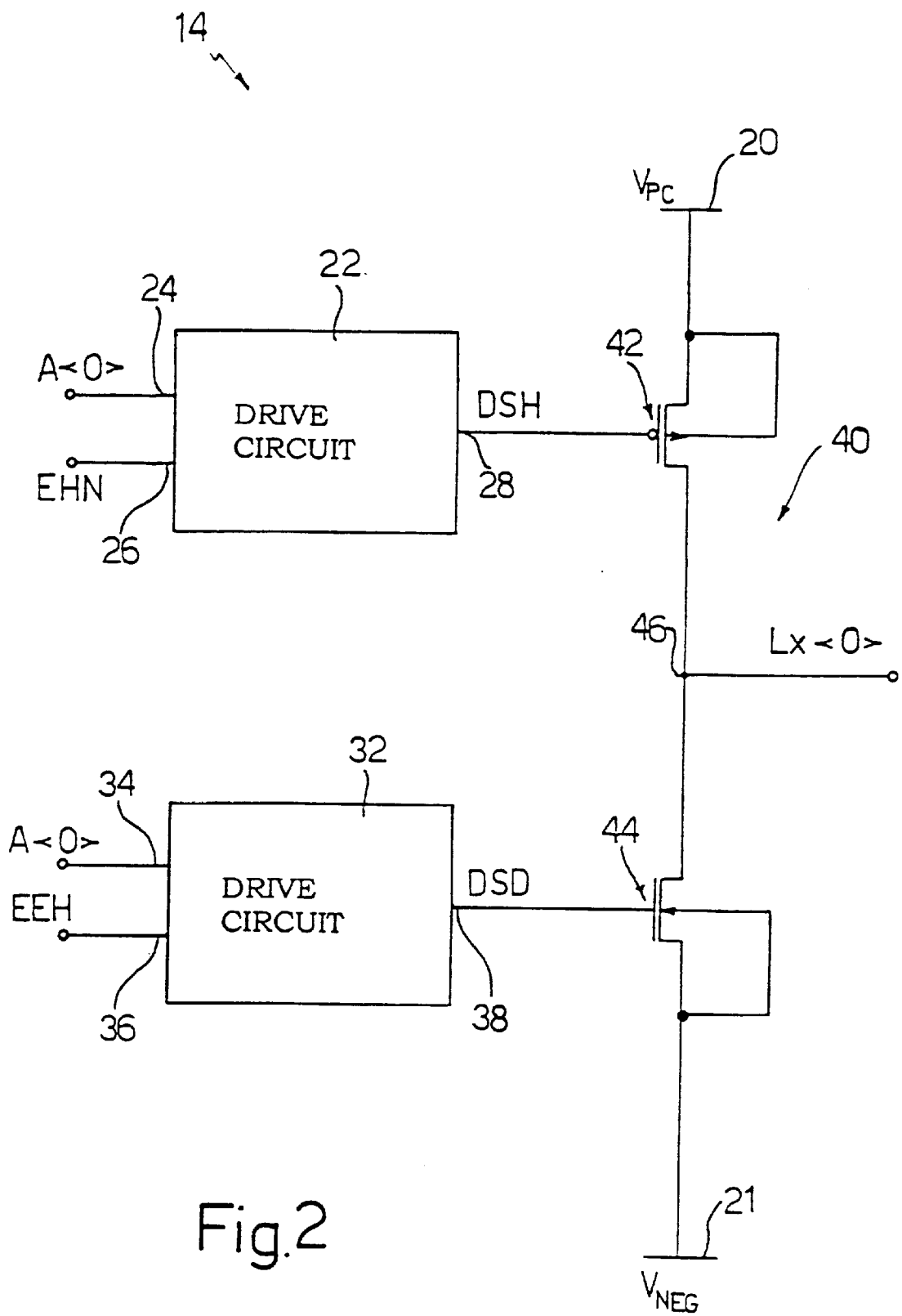

FIG. 2 shows the block diagram of a pre-decoding circuit 14 receiving at the input an address signal, for example A<0>, and the program and erase enabling signals EHN and EEH, and generating at the output a pre-decoding signal, for example Lx<0>.

The pre-decoding circuit 14 includes a first supply line 20 set to a voltage $V_{PC}$ which, during the reading, is equivalent to a supply voltage $V_{CC}$ of the memory device (i.e., 3–5 V), during programming is equivalent to a program voltage $V_{PP}$, greater than $V_{CC}$ (for example, 12 V), and during erasing is equivalent to a first erase voltage $V_{ERP}$ smaller than $V_{CC}$ (for example, 2 V); a second supply line 21 set to a voltage $V_{NEG}$ which, during reading and programming, is equivalent to a ground voltage $V_{GND}$ (typically 0 V) and during erasing is equivalent to a second erase voltage $V_{ERN}$ smaller than the ground voltage $V_{GND}$ (for example, −8 V); a first drive circuit 22 which has first and second input terminals 24, 26 which receive address signal A<0> and program enabling signal EHN respectively, and an output terminal 28 supplying a first drive signal DSH; a second drive circuit 32 which has first and second input terminals 34, 36 receiving address signal A<0> and erase enabling signal EEH respectively, and an output terminal 38 supplying a second drive signal DSD; and an output circuit 40 of the push-pull type which comprises a pull-up PMOS transistor 42 and a pull-down NMOS transistor 44, which have gate terminals receiving respectively the first and second drive signal DSH, DSD, drain terminals connected to one another (output node 46, to which the pre-decoding signal Lx<0> is supplied), and source terminals connected respectively to the first and the second supply line 20, 21.

The pre-decoding circuits 15 have the same structure as the pre-decoding circuits 14, except for the fact that the output node 46 of circuits 15 (which supplies signals P<i>)

is connected to an EXNOR gate to output signals PFN<i>, as explained in greater detail hereinafter with reference to FIG. 6.

Figure 3:
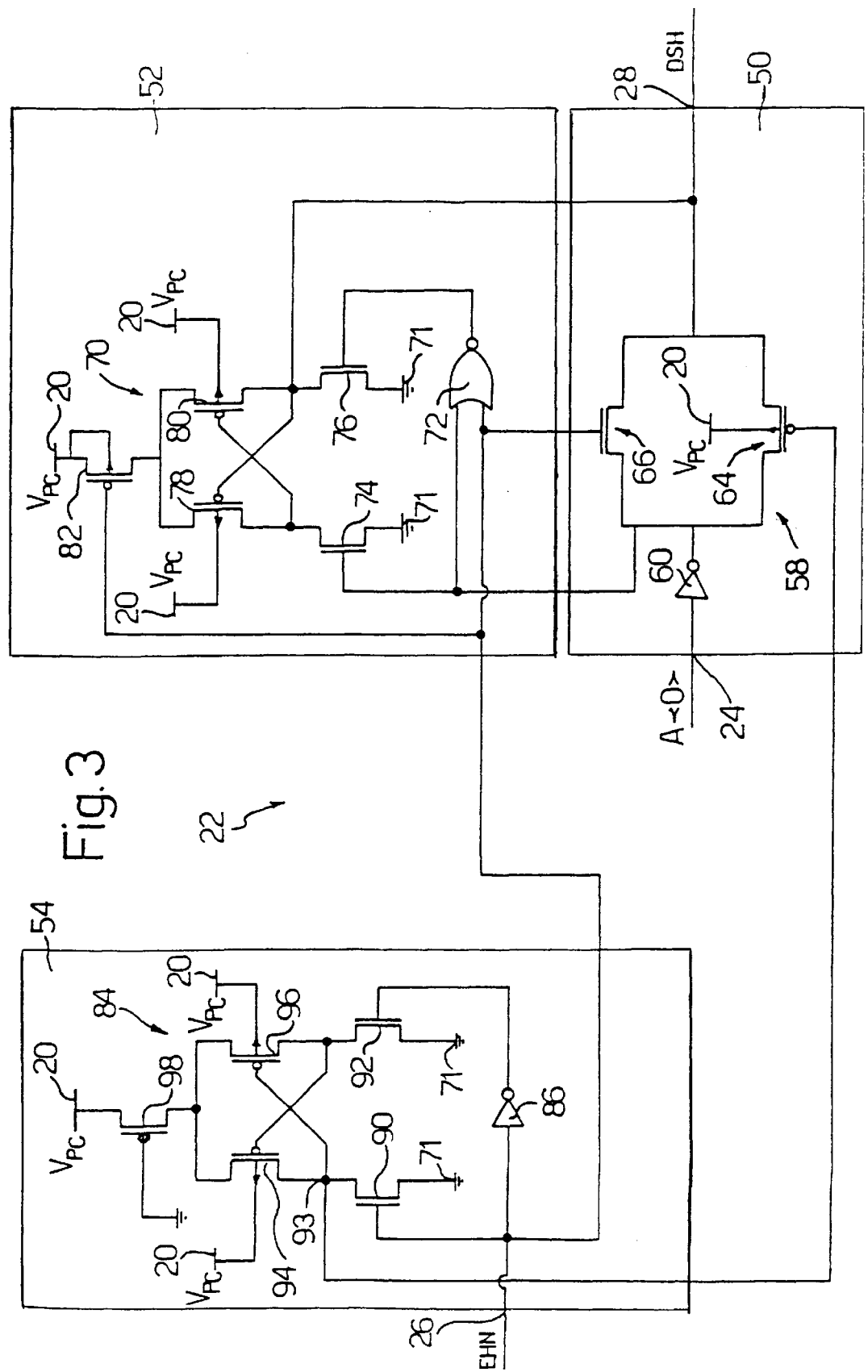

FIG. 3 shows the electric diagram of the first drive circuit 22. As shown, first drive circuit 22 includes a first and a second path 50, 52 separated from one another and disposed in parallel, and a selection circuit 54 for selectively enabling the two paths 50, 52.

The first path 50 is used for reading, i.e., when the voltage $V_{PC}$ of the first supply line 20 is equivalent to voltage $V_{CC}$, to supply voltage $V_{CC}$ or voltage $V_{GND}$ to the gate terminal of PMOS transistor 42 of output circuit 40, as specified by the address signal A<0>.

The first path 50 includes substantially a CMOS switch 58 and an inverter 60 interposed between first input terminal 24 and CMOS switch 58. In particular, CMOS switch 58 includes a PMOS transistor 64 and an NMOS transistor 66 having source terminals connected to one another and to the output of inverter 60, drain terminals connected to one another and to the output terminal 28, and gate terminals respectively connected to an output terminal of the selection circuit 54 and the second input terminal 26.

The second path 52 is used when voltage $V_{PC}$ is different from $V_{CC}$ and specifically during programming, when voltage $V_{PC}$ of the first supply line 20 is equivalent to voltage $V_{PP}$, and during erasing, when voltage $V_{PC}$ is equivalent to voltage $V_{FRP}$, to supply voltage $V_{PC}$ or voltage $V_{GND}$ to the gate terminal of PMOS transistor 42 of the output circuit 40, as specified by the address signal A<0>.

The second path 52 comprises substantially a voltage shifter 70 and a NOR gate 72. In particular, voltage shifter 70 includes two NMOS transistors 74, 76 and three PMOS transistors 78, 80, 82.

In detail, NMOS transistor 74 has a source terminal connected to ground (defining a third supply line 71 set to the voltage $V_{GND}$), a drain terminal connected to the drain terminal of PMOS transistor 78, and a gate terminal connected to the source terminal of NMOS transistor 66; the NMOS transistor 76 has a source terminal connected to ground 71, a drain terminal connected to the drain terminal of PMOS transistor 80 and to the output terminal 28, and a gate terminal connected to an output terminal of NOR gate 72; PMOS transistor 78 has a source terminal connected to the drain terminal of PMOS transistor 82 and a gate terminal connected to the drain terminal of PMOS transistor 80; PMOS transistor 80 has a source terminal connected to the drain terminal of PMOS transistor 82 and a gate terminal connected to the drain terminal of PMOS transistor 78; and PMOS transistor 82 has a source terminal connected to the first supply line 20 and a gate terminal connected to the second input terminal 26.

Finally NOR gate 72 has a first input terminal connected to the source terminal of NMOS transistor 66 and a second input terminal connected directly to the second output terminal 26.

The selection circuit 54 comprises a voltage shifter 84 formed by two NMOS transistors 90, 92, three PMOS transistors 94, 96, 98 and an inverter 86.

In particular, NMOS transistor 90 has a source terminal connected to ground, a drain terminal connected to the drain terminal of PMOS transistor 94 (node 93) and to the gate terminal of PMOS transistor 64 of CMOS switch 58, and a gate terminal connected to the second input terminal 26; NMOS transistor 92 has a source terminal connected to ground, a drain terminal connected to the drain terminal of PMOS transistor 96, and a gate terminal connected to the output terminal of inverter 86; PMOS transistor 94 has a source terminal connected to the drain terminal of PMOS transistor 98 and a gate terminal connected to the drain terminal of PMOS transistor 96; PMOS transistor 96 has a source terminal connected to the drain terminal of PMOS transistor 98 and a gate terminal connected to the drain terminal of PMOS transistor 94; and PMOS transistor 98 has a source terminal connected to the first supply line 20 and a gate terminal connected to ground 71. Finally the inverter 86 has an input terminal connected to the second input terminal 26.

Figure 4:
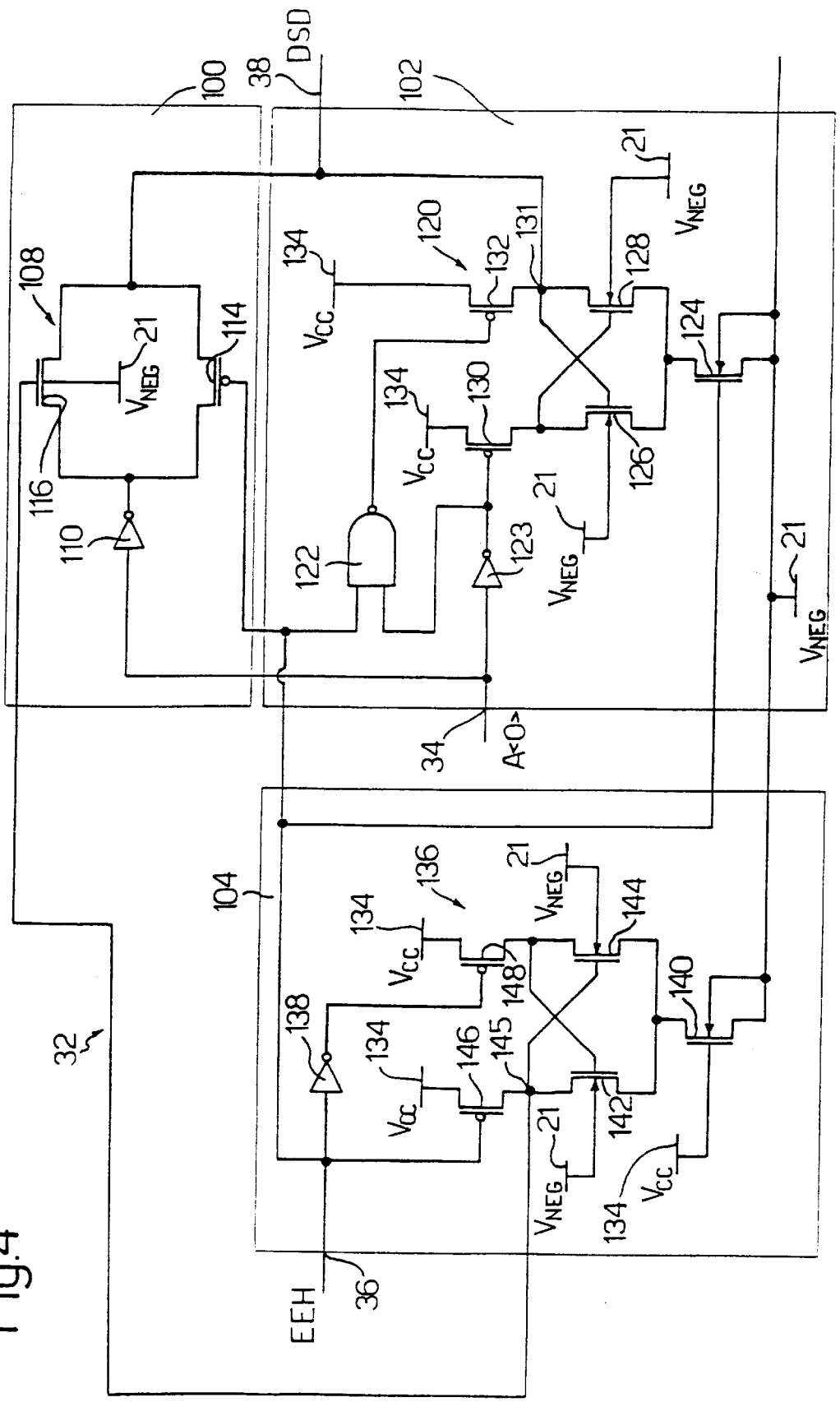

FIG. 4 shows the electric diagram of the second drive circuit 32, which, similarly to first drive circuit 22, includes a first path 100 and a second path 102, separated from one another and arranged in parallel, and a selection circuit 104 for selectively enabling the two paths 100, 102.

The first path 100 is used for reading and programming, i.e., when voltage $V_{NEG}$ of the second supply line 21 is equivalent to ground voltage $V_{GND}$, to supply voltage $V_{CC}$ or voltage $V_{GND}$ to the gate terminal of NMOS transistor 44 of output circuit 40, as specified by address signal A<0>.

The first path 100 includes substantially a CMOS switch 108 and an inverter 110 interposed between the first input terminal 34 and CMOS switch 108. In particular, CMOS switch 108 includes a PMOS transistor 114 and an NMOS transistor 116 which have source terminals connected to one another and to the output terminal of the inverter 110, drain terminals connected to one another and to output terminal 38 and gate terminals connected respectively to the second input terminal 36 and to an output terminal of selection circuit 104, as described in greater detail hereinafter.

The second path 102 is used during erasing, i.e., when voltage $V_{NEG}$ of the second supply line 21 is equivalent to second erase voltage $V_{ERN}$, so as to supply second erase voltage $V_{ERN}$ or voltage $V_{CC}$ to the gate terminal of NMOS transistor 44 of output circuit 40, as specified by the address signal A<0>.

The second path 102 includes substantially a voltage shifter 120, a NAND gate 122 and an inverter 123.

In particular, voltage shifter 120 includes three NMOS transistors 124, 126, 128 and two PMOS transistors 130, 132. In detail, NMOS transistor 124 has a source terminal connected to second supply line 21, a drain terminal connected to the source terminals of NMOS transistors 128, 126, and a gate terminal connected to the second input terminal 36; NMOS transistor 126 has a drain terminal connected to the drain terminal of PMOS transistor 130 and to the gate terminal of NMOS transistor 128, and a gate terminal connected to the drain terminal of NMOS transistor 128; NMOS transistor 128 has a drain terminal connected to the drain terminal of PMOS transistor 132 and to the gate terminal of NMOS transistor 126, and a gate terminal connected to the drain terminal of NMOS transistor 126; PMOS transistor 130 has a source terminal connected to a fourth supply line 134 set to voltage $V_{CC}$, and a gate terminal connected to an output terminal of inverter 123, which in turn has an input terminal connected to the first input terminal 34; and PMOS transistor 132 has a source terminal connected to the fourth supply line 134, and a gate terminal connected to an output terminal of NAND gate 122. Finally NAND gate 122 has a first input terminal connected to the output terminal of inverter 123, and a second input terminal connected directly to the second input terminal 36.

Selection circuit 104 includes a voltage shifter 136 having an inverter 138 and three NMOS transistors 140, 142, 144 and two PMOS transistors 146, 148, similar to and connected like NMOS transistors 124, 126 and 128 and PMOS transistors 130, 132, with the only differences that NMOS transistor 140 has a gate terminal connected to the fourth supply line 134, PMOS transistor 146 has a gate terminal connected to the second input terminal 36, and PMOS transistor 148 has a gate terminal connected to an output terminal of inverter 138. The latter has its input terminal connected to second input terminal 36.

The pre-decoding circuit 14 functions as follows.

As already stated, during reading voltage $V_{PC}$ is equal to voltage $V_{CC}$, second supply line 21 is set to $V_{GND}$, program enabling signal EHN is high (set to $V_{CC}$) and the erase enabling signal EEH is low (set to $V_{GND}$).

In this condition, in first drive circuit 22 (FIG. 3), NMOS transistor 90 is switched on, node 93 is low and CMOS switch 58 is enabled. In addition, PMOS transistor 82 is switched off, and thus level shifter 70 is disabled.

Thereby, first drive signal DSH is generated by the first path 50 and is inverted with respect to address signal A<0>.

In addition, in second drive circuit 32 (FIG. 4), because of the low logic level of erase enabling signal EEH, PMOS transistor 146 is on, node 145 is high and CMOS switch 108 is enabled. On the other hand, NMOS transistor 124 is off and thus level shifter 120 is disabled.

Thereby, second drive signal DSD is generated via the first path 100 and is inverted with respect to address signal A<0>.

Consequently, during reading, both NMOS and PMOS transistors 42, 44 (FIG. 2) are driven by a drive signal which is inverted with respect to A<0>, and thus form an inverter of conventional type, wherein output terminal 46 of pre-decoding circuit 14 is connected selectively to first and second supply line 20, 21 by NMOS and PMOS transistors 42, 44, thus assuming logic levels which are set by voltages $V_{CC}$-$V_{GND}$.

As already stated, during programming first supply line 20 assumes value $V_{PP}$, second supply line 21 is set to $V_{GND}$, and program and erase enabling signals EHN and EEH are at a low logic level ($V_{GND}$).

In this condition, in first drive circuit 22 (FIG. 3) NMOS transistor 90 is off, NMOS transistor 92 is on, as is PMOS transistor 94, node 93 is high (set to $V_{PP}$) and CMOS switch 58 is disabled. In addition, PMOS transistor 82 is on, and thus level shifter 70 is enabled.

Thereby, first drive signal DSH is generated via the second path 52 and has a low logic level ($V_{GND}$) or a high logic level ($V_{PP}$) according to the logic level of the address signal A<0>. In practice, first drive signal DSH is inverted with respect to address signal A<0>, and has a high translated logic level.

In addition, because of the low logic level of erase enabling signal EEH, second drive circuit 32 functions in the same manner as described above for reading, with CMOS switch 108 enabled and level shifter 120 disabled, thus second drive signal DSD is generated via first path 100.

Output terminal 46 of pre-decoding circuit 14 (FIG. 2) thus assumes logic levels which are set by voltages $V_{PP}$-$V_{GND}$.

As already stated, during erasing, first supply line 20 is set to $V_{ERP}$, second supply line 21 is set to $V_{ERN}$, and program enabling signal EHN is at a low logic level ($V_{GND}$) and erase enabling signal EEH is at a high logic level ($V_{CC}$).

In this condition, first drive circuit 22 (FIG. 3) operates as described above for the programming step, with CMOS switch 58 disabled and level shifter 70 enabled, thus first drive signal DSH is generated via the second path 52, and has a low logic level ($V_{GND}$) or a high logic level ($V_{ERP}$) according to the logic level of address signal A<0>.

In addition, the second drive circuit 32 (FIG. 4), owing to the high logic level of erase enabling signal EEH, PMOS transistor 146 is off and PMOS transistor 148 is on; consequently NMOS transistor 142 is on and node 145 has a low logic level (equal to $V_{ERN}$); CMOS switch 108 is thus disabled. In addition, NMOS transistor 124 is on and thus the level shifter 120 is enabled.

Thereby, second drive signal DSD is generated via the second path 102 and has a low logic level ($V_{ERN}$) or a high logic level ($V_{CC}$) according to the address signal A<0>. In practice, second drive signal DSD is inverted with respect to address signal A<0> and has low translated logic levels.

Consequently during erasing, the output terminal 46 of pre-decoding circuit 14 assumes logic levels defined by voltages $V_{ERP}$-$V_{ERN}$. This biasing is particularly useful for limiting the stress on final inverters of the final decoding circuit 16, as explained in greater detail hereinafter. As an alternative, during erasing also the first supply line is set to $V_{CC}$, in which case first drive circuit 22 operates as described for reading, generating first drive signal DSH via CMOS switch 58.

FIG. 5 shows schematically a portion of final decoding circuit 16, for 25 driving two rows of the memory array, for example rows 0 and 1, and thus receiving as input pre-decoding signals Lx<0>, Ly<0>, Lz<0>, PFN<0>, PFN<1> and erase enabling signal EEH, and generating bias signals R<0>, R<1> as outputs.

As shown in FIG. 5, an NAND gate 150 has three input terminals receiving respectively pre-decoding signals Lx<0>, Ly<0>, Lz<0> and an output terminal supplying a signal EGN and connected to a first input terminal of a NAND gate 152; the latter has a second input terminal receiving erase enabling signal EEH and an output terminal connected to the input terminal of an inverter 162. Output 163 of inverter 162 is connected to a plurality of drive branches 153.0, 153.1, . . . each for a respective row, enabled by respective pre-decoding signals PFN<i> (and in the example in FIG. 5 by signals PFN<0> and PFN<1>).

In particular, each drive branch includes a NOR gate 156.0, 156.1, . . . having a first input connected to the output of inverter 162, and a second input connected to an output of a respective NOR gate 154.0, 154. 1, . . . The NOR gates 154.0, 154.1, . . . , in turn respectively have a first input terminal connected to the output of NAND gate 150 and a second input terminal receiving a respective signal PFN<i>.

Pre-decoding signals PFN<i> are generated by respective EXNOR gates 172, as shown in FIG. 6. In detail, EXNOR gate 172 has a first input terminal receiving erase enabling signal EEH and a second input terminal receiving a respective signal P<i> present on node 46 of pre-decoding circuits 15 similarly structured to the pre-decoding circuit 14 of FIG. 2, such as to implement in practice the function:

$$PFN\langle i \rangle = P\langle i \rangle \cdot EEH + \overline{EEH} \cdot \overline{P\langle i \rangle}$$

With reference again to FIG. 5, the outputs of NOR gates 156.0, 156. 1, . . . have output terminals connected to input terminals of inverters 164.0, 164.1, respectively, . . . , which supply at their own outputs the bias signals R<0>, R<1>, . . . to a respective row.

In final decoding circuit in FIG. 5, all logic gates are supplied via the first and the second supply line 20, 21, and thus between $V_{PC}$, and $V_{NEG}$.

Final decoding circuit 16 operates as follows.

During reading and programming, erase enabling signal EEH is low and node 163 is low, irrespective of whether or not the group of rows biased by final decoding circuit 16 has or has not been selected by pre-decoding signals Lx<0>, Ly<0>, Lz<0>. Consequently, bias signals R<0>, R<1>, . . . assume a high or low logic value according to the logic value of pre-decoding signals PFN<0> and PFN<1>, . . . ; thereby the address of a single row or a plurality of rows within the group can be obtained.

During erasing, erase enabling signal EEH is high and node 163 is low only when the group of rows associated with pre-decoding signals Lx<0>, Ly<0>, L,z<0> is selected by a high logic value of pre-decoding signals.

In this situation, bias signals R<0>, R<1>, . . . assume a high logic value (equal to $V_{ERP}$) when the respective pre-decoding signal PFN<0>, PFN<1>, . . . has a low logic value, and vice versa they have a low logic value (equal to $V_{ERN}$) when predecoding signals PFN<0>, PFN<1>, . . . are high.

The groups of rows which are not selected are biased to voltage $V_{ERP}$ irrespective of the value of pre-decoding signals PFN<i>.

Consequently, in the erasing step it is possible to address also a single row, making the respective pre-decoding signal PFN assume a high logic level. However the possibility still exists of erasing the entire sector, simply by making all pre-decoding signals LIx, Ly, Lz and PFN assume a high logic level.

Thereby, memory device 1 has greater operative flexibility, and memory allocation control is more efficiently than in known memory devices, with the disadvantage of a slight increase of area occupied by the decoding circuits. However a larger area increase is obtained for the pre-decoding circuits 14, I5, which nevertheless, since arranged outside the memory array, are less critical in this respect.

The use of four separate paths allows very short reading access times. In fact the direct path through CMOS switches (used during reading) provides very fast propagation times, since feedback structures are not used for most of the uses of the memory. On the other hand, the paths with the shifters, allowing the voltage translation necessary for programming and erasing, are slower, but in fact are used less frequently than direct paths.

In addition, in row decoders of known flash memory devices, NMOS transistors 42, 44 define an output inverter which, during switching, has consumption caused by crowbar current; on the other hand, in the present decoder driving of these NMOS transistors 42, 44 is separate and permits elimination of this consumption.

The described decoder can advantageously be used to replace flexible memory components (floppy discs) for computers, since it can reproduce their internal organization into sectors with the advantage of eliminating mechanical drive units.

Finally, it is apparent that changes and variants can be made to the row decoder described and illustrated here, without departing from the scope of the present invention.

What is claimed is:

1. A row decoder for a flash-EEPROM memory device, comprising a decoding stage having at least one decoding circuit, a first line set to a first reference potential, a second line set to a second reference potential which switches between said first reference potential and an erase potential lower than the first reference potential; wherein said decoding circuit comprises a first path and a second path arranged in parallel to one another between a first input terminal and a first common output node and connected respectively to said first line and said second line, and a first selection circuit selectively enabling said first and second paths.

2. The decoder according to claim 1 wherein said decoding stage forms a pre-decoding stage, said decoding circuit forms a pre-decoding circuit and the decoder further comprises a final decoding stage connected in cascade to said pre-decoding stage and comprising at least one final decoding circuit.

3. The decoder according to claim 2, further comprising a third line set to a third reference potential, and a fourth line set to a fourth reference potential switching between said third reference potential and at least one program potential greater than the third reference potential; wherein said pre-decoding circuit has said first input terminal and a second input terminal receiving respectively a first address signal and a first control signal switching between a first level and a second level, and a first output terminal supplying a first pre-decoding signal switching at least between said first and third reference potentials and said erase and program potentials; said pre-decoding circuit comprising an output circuit connected between said fourth and second lines and having an output terminal forming said output terminal of said pre-decoding circuit, said output circuit being connected to said first common output node, said first and second paths receiving said first address signal and said first control signal and generating respectively a first drive signal for said output circuit switching between said first and third reference potential and a second drive signal for said output circuit switching between said erase potential and said third reference potential.

4. The decoder according to claim 3 wherein said first selection circuit comprises a first voltage shifter connected to said second and third lines and having an input terminal receiving said first control signal and an output terminal supplying a selection signal which has selectively said erase potential and said third reference potential in presence respectively of said first level and said second level of said first control signal.

5. The decoder according to claim 4 wherein said first path comprises a controlled switch component having an input terminal receiving said first address signal and an output terminal supplying said first drive signal which has selectively said erase potential and said third reference potential in presence respectively of said first level and said second level of said address signal.

6. The decoder according to claim 5 wherein said controlled switch component comprises an CMOS switch having a first and a second control terminal receiving respectively said selection signal and said first control signal.

7. The decoder according to claim 3 wherein said second path comprises a second voltage shifter circuit connected to said second and third lines and having a first input terminal receiving said first control signal, a second input terminal receiving said first address signal and an output terminal supplying said second drive signal having respectively said erase potential in presence of said first level of said first control signal and of said first level of said address signal, and said third reference potential in presence of said first level of said first control signal and of said second level of said address signal.

8. The decoder according to claim 3 wherein said pre-decoding circuit comprises:

a third path and a fourth path in parallel to one another, forming a second common output node and connected respectively to said third line and to said fourth line; and a second selection circuit selectively enabling said third and fourth paths.

9. The decoder according to claim 8 wherein said pre-decoding circuit has further a third input tenninal and a fourth input terminal receiving respectively said first address signal and a second control signal switching between said first level and a second level, said third and fourth paths being interposed between said third and fourth input terminals and said output circuit, receiving said first address signal and said second control signal and generating respectively a third drive signal for said output circuit switching between said first and third reference potentials and a fourth drive signal for said output circuit switching at least between said first reference potential and said program potential.

10. The decoder according to claim 9 wherein said second selection circuit comprises a third voltage shifter circuit connected to said first and fourth lines and having an input terminal which receives said second control signal and an output terminal supplying a second selection signal switching at least between said first reference potential and said program potential when said second control signal assumes respectively said first level and said second level.

11. The decoder according to claim 10 wherein said third path comprises a controlled switch component having an input terminal receiving said first address signal and an output terminal supplying said third drive signal and having said first and third reference potential in presence respectively of said first level and said second level of said address signal.

12. The decoder according to claim 9 wherein said fourth path comprises a fourth voltage shifter circuit connected to said first and fourth lines and having a first input terminal receiving said second control signal, a second input terminal receiving said first address signal and an output terminal supplying said fourth drive signal, said fourth drive signal having respectively said first reference potential in presence of said second level of said second control signal and of said first level of said address signal, and said program potential in presence of said second level of said second control signal and of said second level of said address signal.

13. The decoder according to claim 8 wherein said output circuit comprises a push-pull circuit including an upper transistor element and a lower transistor element connected in series between said second and fourth lines; each of said upper and lower transistor elements having a respective control terminal connected respectively to the first and second common output nodes.

14. The decoder according to claim 3 wherein said final decoding circuit comprises an input circuit and a plurality of bias circuits connected to said input circuit and to respective array rows of the memory device, said input and bias circuits being connected between said second and fourth lines and generating respective output signals switching at least between said first and third reference potentials and said erase and program potentials.

15. The decoder according to claim 14 wherein said input circuit comprises logic means having a plurality of inputs connected to a plurality of pre-decoding circuits and an output connected to said bias circuits enabling selectively at least one of said bias circuits.

16. The decoder according to claim 15 wherein said logic means receive a plurality of pre-decoding signals and said first control signal and, for each of said bias circuits, generate an enabling signal having said first and third reference potentials and said program potential in presence of said second level of said first control signal and between said erase and third reference potentials in presence of said first level of said first control signal.

17. The decoder according to claim 3 wherein said fourth line switches between said third reference potential, said program potential and a fifth reference potential smaller than said third reference potential and greater than said first reference potential.

18. A method for selecting a subgroup of rows in a sector of a flash memory device having a pre-decoding stage, a final-decoding stage, and a memory array, comprising:
determining whether the memory device is in a reading operation mode, a programming operation mode, or an erasing operation mode;
providing, separately or in combination based on the determined operation mode, first, second, third, or fourth reference potentials to the pre-decoding stage, said second reference potential switching between the first reference potential and an erase potential lower than the first reference potential, said third reference potential being higher than the first reference potential, and said fourth reference potential switching between the third reference potential and a program potential higher than the third reference potential;
providing a program enabling signal, an erase enabling signal, and a plurality of address signals to the pre-decoding stage;
generating a plurality of pre-decoding signals and a plurality of row selection enabling signals;
providing pre-decoding signals, row selection enabling signals, and an erase enabling signal to the final-decoding stage for the selection of rows of the memory device; and
providing access potentials switching between second and fourth reference potentials based on the determined operation mode to the rows of the memory device.

19. The method of claim 18, further comprising selecting a first path of the pre-decoding stage for the reading operation mode and a second path of the pre-decoding stage for the programming and erasing operation modes.

20. A row decoder circuit of a memory device having a memory array, comprising:
first, second, third, and fourth reference potentials, said second reference potential switching between the first reference potential and an erase potential lower than the first reference potential, said third reference potential being higher than the first reference potential, and said fourth reference potential switching between the third reference potential and a program potential higher than the third reference potential;
a first decoding stage coupled to first, second, third, and fourth reference potentials, said first decoding stage having a plurality of pre-decoding circuits receiving address signals, a program enabling signal and an erase enabling signal, and generating a plurality of pre-decoding signals and row selection enabling signals; and
a second decoding stage coupled to the first decoding stage, said second decoding stage having a plurality of final decoding circuits receiving the pre-decoding signals, the erase enabling signal, and the row selection enabling signals, and generating row accessing potentials to each respective row of the memory array.

21. The row decoder circuit of claim 20 wherein the pre-decoding circuit comprises:
first drive circuit having first and second inputs receiving address signal and the program enabling signal respectively, and an output providing a first drive signal;

second drive circuit having first and second inputs receiving address signal and the erase enabling signal respectively, and an output providing a second drive signal; and an output circuit having first and second inputs respectively receiving first and second drive signals, and an output coupled to an output of the pre-decoding circuit for providing the pre-decoding signal or the row selection enabling signal.

22. The row decoder circuit of claim 21, wherein said output circuit comprises a PMOS transistor having a gate terminal coupled to the output of the first drive circuit, a source terminal coupled to the fourth reference potential, and a drain terminal coupled to the output of the pre-decoding circuit; and an NMOS transistor having a gate terminal coupled to the output of the second drive circuit, a source terminal coupled to the second reference potential, and a drain terminal coupled to the output of the pre-decoding circuit.

23. The row decoder circuit of claim 21 wherein said first drive circuit comprises first and second paths in parallel and a first selection circuit, and said second drive circuit comprises first and second paths in parallel and a second selection circuit, said first and second selection circuits receiving program and erase enabling signals respectively for selecting first or second path of each respective first and second drive circuits.

24. The row decoder circuit of claim 23 wherein said first paths of first and second drive circuits each comprises a controlled switched circuit, said second paths of first and second drive circuits each comprises a voltage shifter circuits, and said first and second selection circuits each comprises a voltage shifter circuits.

25. The row decoder circuit of claim 21 wherein some of said pre-decoding circuit each further comprises an EXNOR circuit for generating the row selection enabling signal.

26. The row decoder circuit of claim 20 wherein said final decoding circuit comprises:

an input circuit receiving a plurality of pre-decoding signals and the erase enabling signal; and a plurality of bias circuits coupled to the input circuit, said each bias circuit receiving a respective row selection enabling signal and gene rating the row accessing potential to respective row of the memory array.

* * * * *